US007024606B2

(12) United States Patent  (10) Patent No.: US 7,024,606 B2
Yamauchi  (45) Date of Patent: Apr. 4, 2006

(54) METHOD OF GENERATING TEST PATTERN FOR INTEGRATED CIRCUIT

(75) Inventor: Hisashi Yamauchi, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 178 days.

(21) Appl. No.: 10/736,934

(22) Filed: Dec. 16, 2003

(65) Prior Publication Data
US 2004/0153930 A1 Aug. 5, 2004

Related U.S. Application Data

(63) Continuation of application No. 09/265,346, filed on Mar. 9, 1999, now abandoned.

(30) Foreign Application Priority Data
Mar. 10, 1998 (JP) .................................. 10-58188

(51) Int. Cl.
G01R 31/28 (2006.01)

(52) U.S. Cl. ...................... 714/727; 714/738; 714/728; 714/745

(58) Field of Classification Search .................... 716/6, 716/4; 714/726–739, 745, 8, 724; 356/640; 250/559.24; 348/245, 247; 326/83, 86, 326/87
See application file for complete search history.

(56) References Cited

U.S. PATENT DOCUMENTS 3,949,162 A 4/1976 Malueg
5,812,561 A 9/1998 Giles et al.
5,831,990 A 11/1998 Queen et al.
6,094,069 A 7/2000 Magane et al.
6,189,128 B1 2/2001 Asaka

FOREIGN PATENT DOCUMENTS

JP 402059679 A 12/1989
JP 401321562 A 2/1990

OTHER PUBLICATIONS

Schilling et al. (Electronic Circuits: Discrete and Integrated, 1979; pp. 560-615).*

* cited by examiner

Primary Examiner—Guy J. Lamarre
(74) Attorney, Agent, or Firm—Katten Muchin Rosenman LLP

(57) ABSTRACT

A method for preventing the scale of a circuit from being extended and for preventing noise from being generated by a simultaneous value change in output buffers includes: the first process of checking the number of output buffers 15A through 15D whose output values change when boundary scan cells 13E through 13H output input patterns; the second process of checking the noise value generated by the change in the output values when all output values from the output buffers checked in the first process change; the third process of selecting the output buffer from the buffers checked in the first process such that the noise value checked in the second process can be within the noise allowable value; and the fourth process of outputting as a test pattern a pattern obtained by amending the input pattern such that the output value of the output buffer selected in the third process can change.

4 Claims, 19 Drawing Sheets

| PATTERN NUMBER | OUTPUT TERMINAL 16A | OUTPUT TERMINAL 16B | OUTPUT TERMINAL 16C | OUTPUT TERMINAL 16D |
|---|---|---|---|---|
| 0 | 0 | 0 | 0 | 0 |
| 1 | 1 | 1 | 1 | 1 |
| 2 | 0 | 1 | 0 | 1 |

TEST PATTERN

FIG.6

| PATTERN NUMBER | OUTPUT TERMINAL 16A | OUTPUT TERMINAL 16B | OUTPUT TERMINAL 16C | OUTPUT TERMINAL 16D |
|---|---|---|---|---|
| 0 | 0 | 0 | 0 | 0 |
| 1-1 | 1 | 1 | 0 | 0 |
| 1-2 | 1 | 1 | 1 | 1 |
| 2 | 0 | 1 | 0 | 1 |

FIG.7

| PATTERN NUMBER | OUTPUT TERMINAL 16A | OUTPUT TERMINAL 16B | OUTPUT TERMINAL 16C | |
|---|---|---|---|---|
| 0 | 0 | 0 | 0 | |
| 1-1 | 1 | 0 | 0 | TEST PATTERN |
| 1-2 | 1 | 1 | 0 | |
| 1-3 | 1 | 1 | 1 | |
| 2-1 | 0 | 1 | 1 | TEST PATTERN |
| 2-1 | 0 | 1 | 0 | |

FIG.10

| PATTERN NUMBER | FIRST GROUP | | SECOND GROUP | |
| --- | --- | --- | --- | --- |
| | OUTPUT TERMINAL 16A | OUTPUT TERMINAL 16B | OUTPUT TERMINAL 16C | OUTPUT TERMINAL 16D |
| 0 | 0 | 0 | 0 | 0 |
| 2-1 | 1 | 1 | 0 | 0 |
| 2-2 | 1 | 1 | 1 | 1 |
| 3-1 | 0 | 1 | 1 | 1 |
| 3-2 | 0 | 1 | 0 | 1 |

FIG.18

METHOD OF GENERATING TEST PATTERN FOR INTEGRATED CIRCUIT

CROSS-REFERENCE TO RELATED APPLICATION

The present application is a continuation of U.S. application Ser. No. 09/265,346 which was filed on Mar. 9, 1999 now abandoned.

BACKGROUND OF THE INVENTION

1. Field of the Invention

The present invention relates to a method of generating a test pattern for an integrated circuit, and more particularly to a method of generating a test pattern used in conducting a test using a boundary scan system.

2. Description of the Prior Art

FIG. 19 shows an example of an integrated circuit using a boundary scan system. In an integrated circuit 100 of FIG. 19, common data applied to input terminals 101A through 101D is applied to an internal circuit 104 through input buffers 102A through 102D and boundary scan cells 103A through 103D. The internal circuit 104 is a logical circuit including various gates, etc. The data from the internal circuit 104 is applied to output terminals 106A through 106D through boundary scan cells 103E through 103H and output buffers 105A through 105D.

In the boundary scan system, a connection state between the integrated circuits 100 can be easily tested after the implementation of each integrated circuit 100 on aboard. The test can be conducted as follows. That is, when the test is conducted, the boundary scan cells 103A through 103H are set in a shift mode. Then, test data is applied to an input terminal 107A. The test data is sequentially transmitted in a shifting operation of the boundary scan cells 103A through 103H through an input buffer 108A. Thus, the test data is first set in the boundary scan cells 103E through 103H on the output side of the integrated circuit 100.

When the test data is completely set, a test clock is applied to the boundary scan cells 103E through 103H. Thus, the boundary scan cells 103E through 103H apply the test data to the output terminals 106A through 106D through the output buffers 105A through 105D. The output data applied to the output terminals 106A through 106D reaches the input terminal of the integrated circuit at the next stage through the wiring on the board. In the integrated circuit at the next stage, the test data received by the input terminal is stored in the corresponding boundary scan cell. The integrated circuit at the next stage transfers the stored test data in the shifting operation as in the integrated circuit 100, and serially outputs the data from the output terminal.

When the output data matches the test data applied to the integrated circuit 100, it proves that a successful wiring is set between the integrated circuit 100 and the integrated circuit at the next stage on the board. On the other hand, if the output data does not match the test data applied to the integrated circuit 100, then it is determined that the wiring between the integrated circuit 100 and the integrated circuit at the next stage on the board is defective. Thus, in the boundary scan system, the connection state between integrated circuits can be easily tested after the implementation of each integrated circuit on the board regardless of the type of the internal circuit 104 in the integrated circuit 100.

The defective wiring between integrated circuits on the board can be: an input value of the integrated circuit on the input side fixed to a grounding potential regardless of an output value of the integrated circuit on the output side; an input value of the integrated circuit on the input side fixed to the potential of the power supply regardless of an output value of the integrated circuit on the output side; etc. Therefore, it is easy to understand that two types of tests should be conducted in the above described test. That is, it is determined whether or not the output of "all 0" is correctly transmitted, and whether or not the output of "all 1" is correctly transmitted.

However, the following problem occurs if it is determined whether or not the output of "all 1" is correctly transmitted immediately after the determination as to whether or not the output of "all 0" is correctly transmitted. That is, since each boundary scan cell is designed in most cases such that its output value cannot be changed in the shift mode, the output buffers 105A through 105D are simultaneously inverted when control exits the shift mode if "1" is input to the boundary scan cells 103E through 103H in the shifting operation with the output value of "0" held in each of the boundary scan cells 103E through 103H. At this time, a large electric current flows through the output buffers 105A through 105D, and generates noise in the power supply and ground. The simultaneous inversion of the output buffers 105A through 105D does not occur in the normal operation. Such noise as is not generated in the normal operation, but is generated by such a large electric current may produce defective test data, thereby interfering a correct test.

As a method of solving the problem, there is a method of delaying the data from the boundary scan cells 103E through 103H by different delay times as described in Japanese Patent Application Laid-Open No. 5-129912. According to the technology, even if the data of the test results from the boundary scan cells 103E through 103H simultaneously change, each of the output buffers 105A through 105D sequentially transmits the data from the boundary scan cells 103E through 103H to the output terminals 106A through 106D based on the delay times. As a result, no large electric current flows through the output buffers 105A through 105D, thereby solving the problem that the noise is generated on the power supply and ground.

However, the above described conventional technology has the following problem. That is, to delay the data from the boundary scan cells 103E through 103H, there should be delay elements having different delay times to be inserted between the boundary scan cells 103E through 103H and the output buffers 105A through 105D. As a result, the integrated circuit 100 becomes undesirably large.

BRIEF SUMMARY OF THE INVENTION

The present invention has been developed to solve the above described problems, and aims at providing a method of generating a test pattern for an integrated circuit capable of preventing the noise from being generated by a simultaneous change in output buffers without an increase in circuit scale.

To solve the above described problem, one aspect of the present invention relates to a method of generating a test pattern for an integrated circuit set in m scan flip-flops when m outputs from a logical circuit are applied to m output terminals through scan flip-flops and output buffers. The method includes: the first process of counting the number of output buffers, whose output values vary, when the m scan flip-flops output input patterns; the second process of checking a noise value generated when all output values from the output buffers counted in the first process change; the third process of selecting the output buffers checked in the first process such that the noise value checked in the second process can be within an allowable noise value; and the fourth process of outputting as a test pattern a pattern obtained by amending the input pattern such that the output values of the output buffers selected in the third process can change.

Another aspect of the present invention relates to a method of generating a test pattern for an integrated circuit set in m scan flip-flops when m outputs from a logical circuit are applied to m output terminals through scan flip-flops and output buffers, and when n (n indicates any natural number) outputs from the logical circuit are applied to m output terminals through the output buffers. The method includes: the first process of counting the number of output buffers, whose output values vary, when the m scan flip-flops output input patterns; the second process of checking a noise value generated when all output values from the output buffers counted in the first process change, and computing a new noise value by adding to the checked noise value a noise value generated when the n output values from the output buffers change; the third process of selecting the output buffers checked in the first process such that the noise value checked in the second process can be within an allowable noise value; and the fourth process of outputting as a test pattern a pattern obtained by amending the input pattern such that the output values of the output buffers selected in the third process can change.

Still another aspect of the present invention relates to a method of generating a test pattern for an integrated circuit set in m scan flip-flops when m outputs from a logical circuit are applied to m output terminals through scan flip-flops and output buffers. The method includes: the first process of grouping the scan flip-flops such that a noise value, generated when all output values from the output buffers belonging to a specific group change, can be within a noise allowable value; the second process of selecting one group from among groups generated in the first process; the third process of outputting as a test pattern a pattern in which only an output value of an output buffer belonging to the group selected by the second process changes when the n scan flip-flops output input patterns, and output values of output buffers belonging to groups not selected in the second process remain unchanged; and the fourth process of repeating the second and third processes on the groups not selected in the second process when the third process is completed.

BRIEF DESCRIPTION OF THE DRAWINGS

This above-mentioned and other objects, features and advantages of this invention will become more apparent by reference to the following detailed description of the invention taken in conjunction with the accompanying drawings, wherein:

FIG. 6 shows an example of a test pattern processed by the method of generating a test pattern for the integrated circuit;

FIG. 7 shows an example of a test pattern generated by the method of generating a test pattern for the integrated circuit;

FIG. 10 shows an example of a test pattern generated by the method of generating a test pattern for the integrated circuit;

FIG. 18 shows an example of a test pattern generated by the method of generating a test pattern for the integrated circuit.

DETAILED DESCRIPTION OF THE PREFERRED EMBODIMENTS

The embodiments of the present invention are described below by referring to the attached drawings.

First Embodiment

Figure 1:
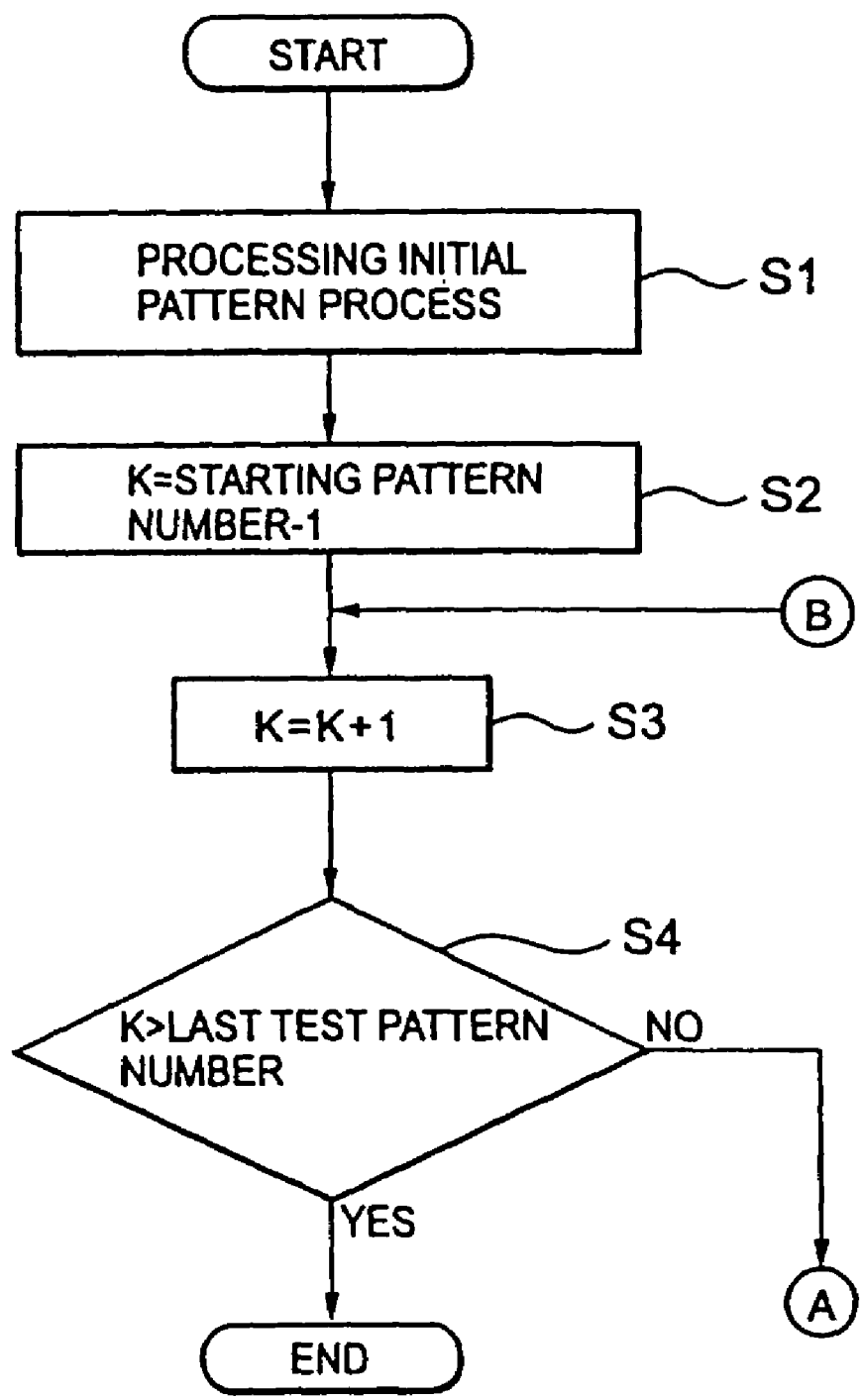
FIG. 1 is a flowchart of the method of generating a test pattern for an integrated circuit according to the first embodiment of the present invention.
Figure 2:
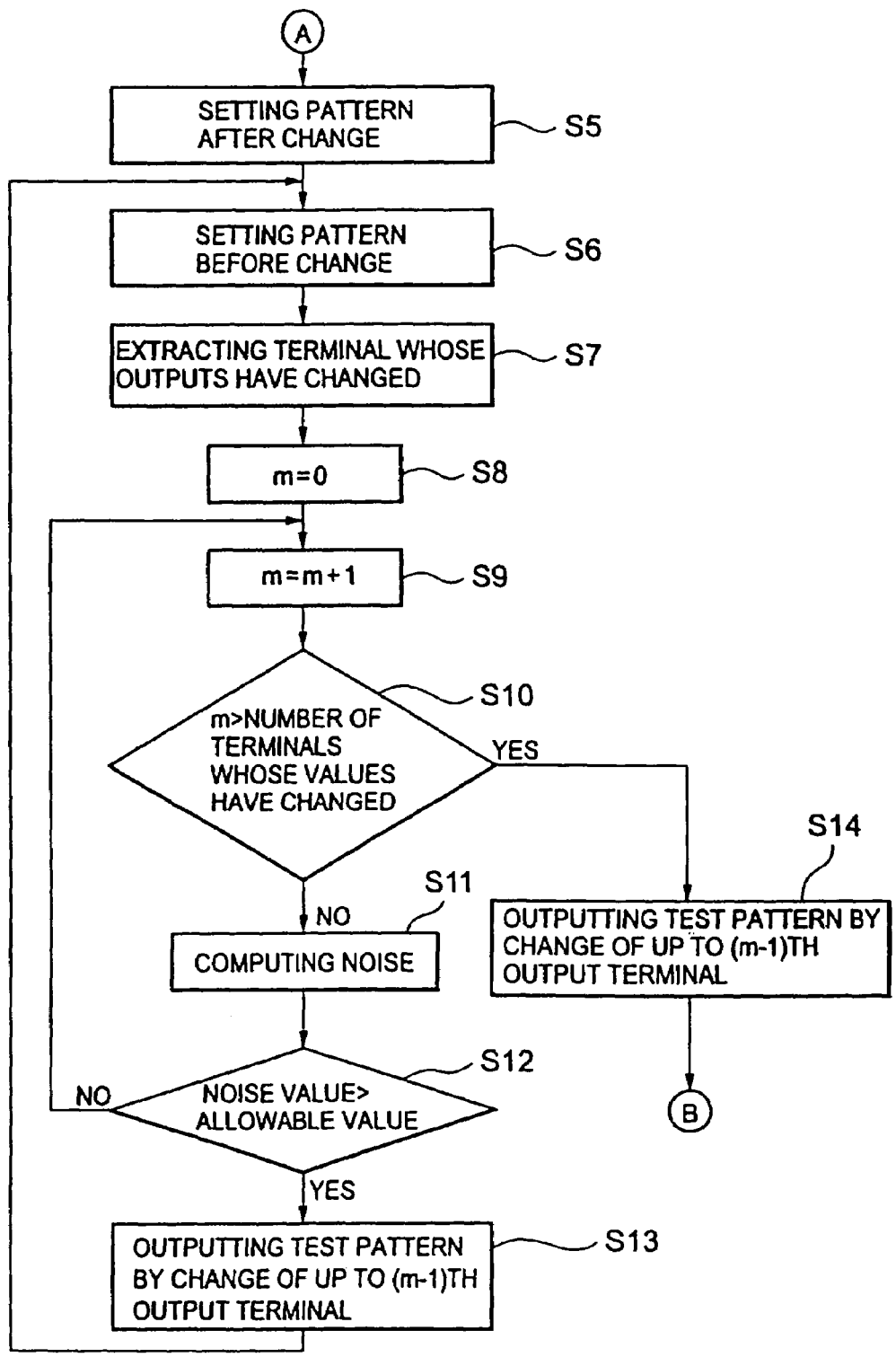
FIG. 2 is a flowchart of the method of generating a test pattern for the integrated circuit.
Figure 3:
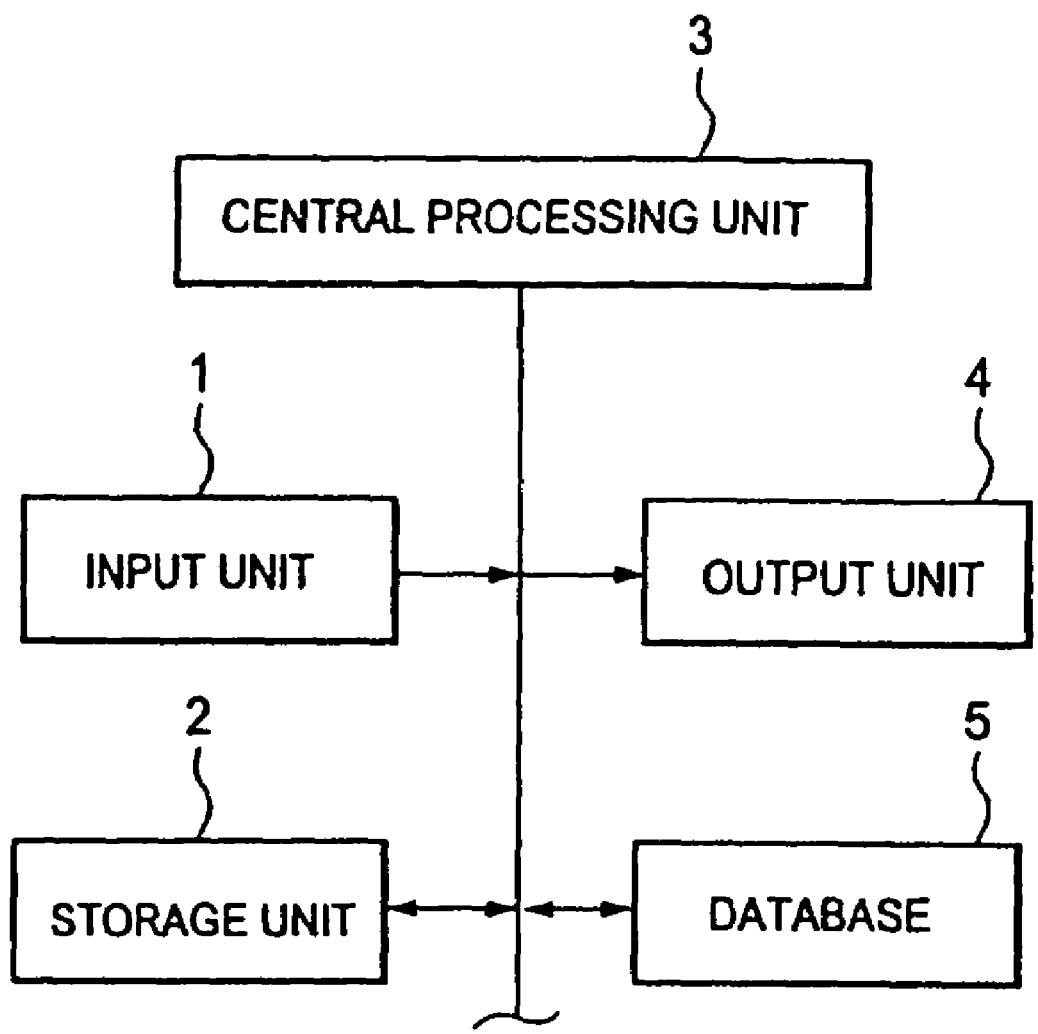
FIG. 3 is a block diagram of the outline of the configuration of the simulation device for embodying the method of generating a test pattern for the integrated circuit.
Figure 4:
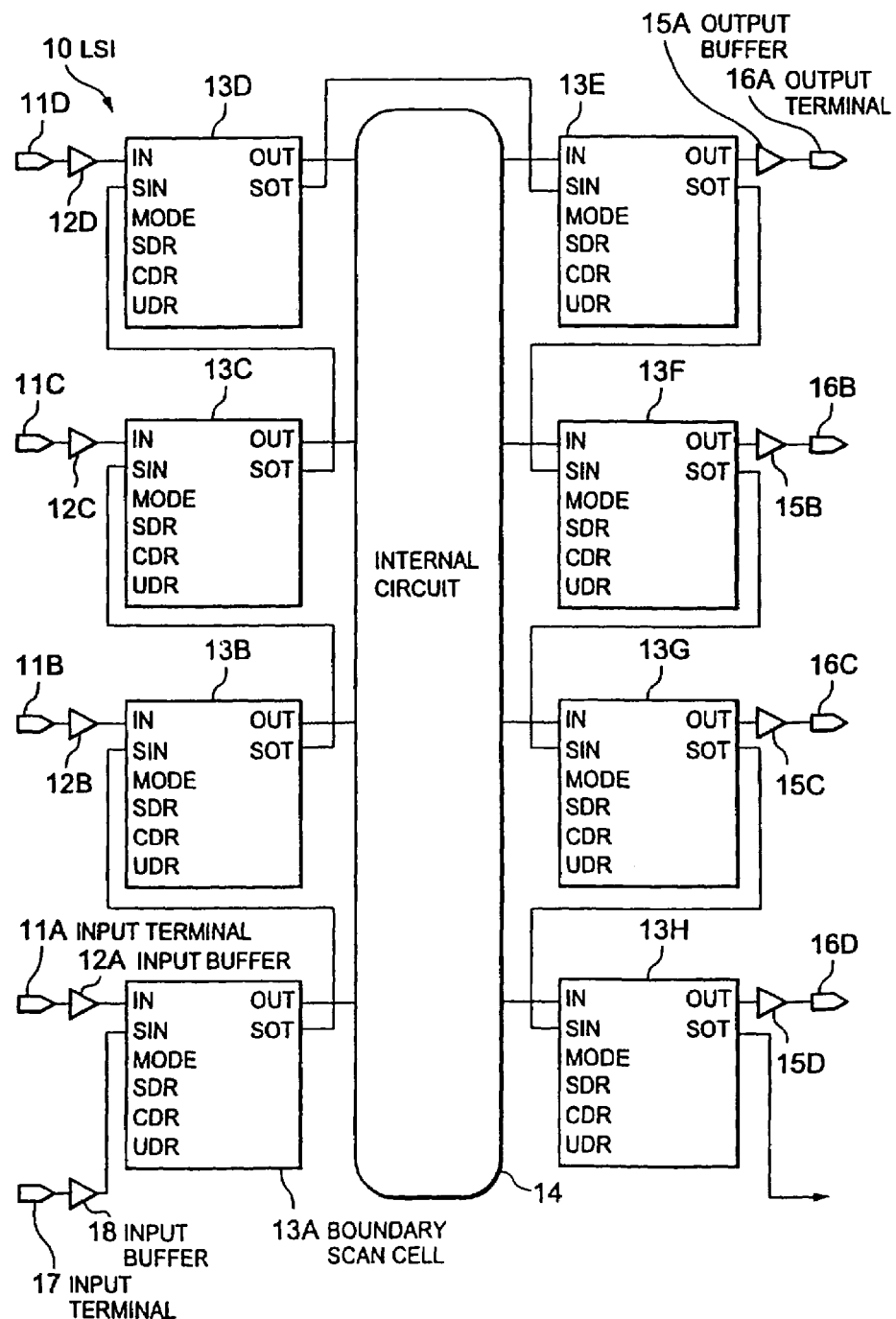
FIG. 4 is a block diagram of the outline of the configuration of an LSI in which a test pattern generated by the method of generating a test pattern for the integrated circuit is used.
Figure 5:
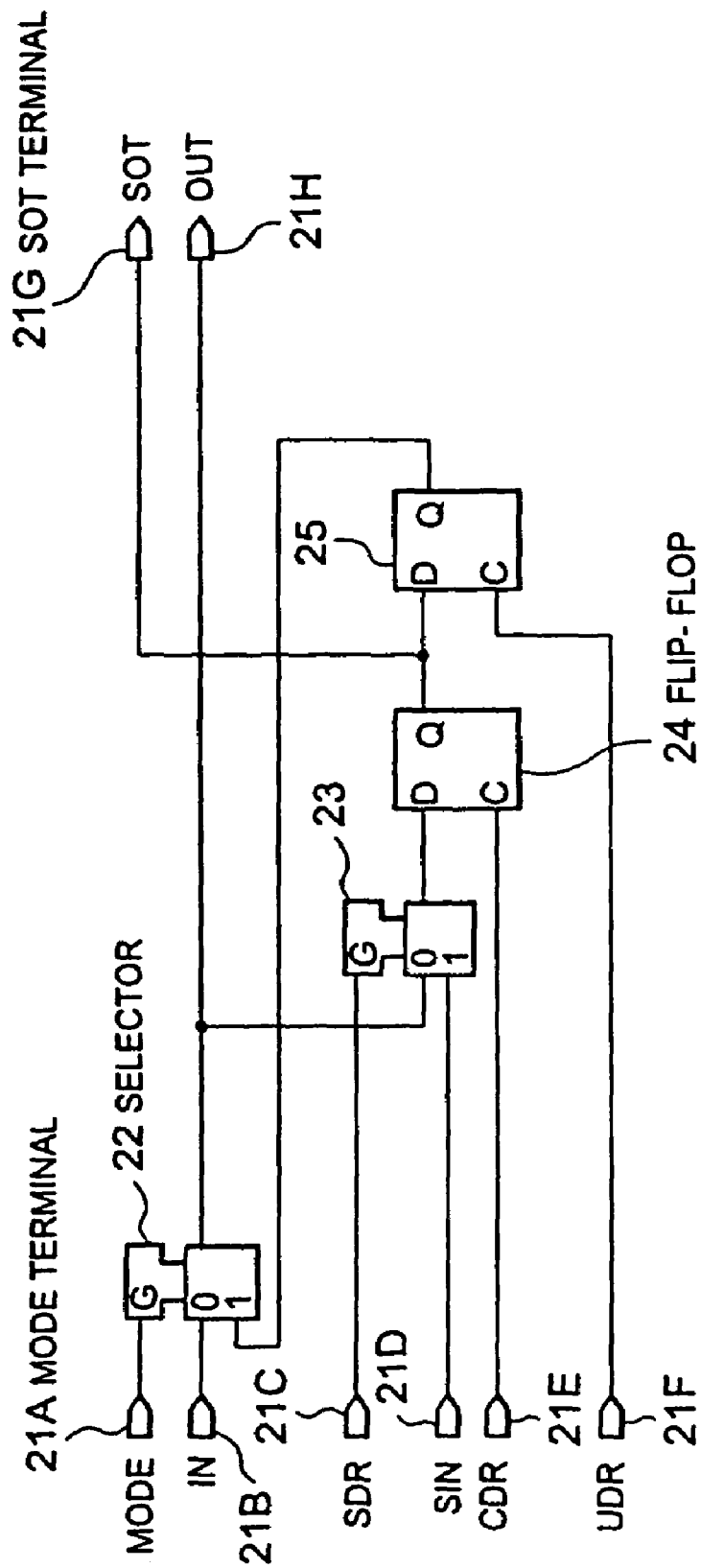
FIG. 5 is a block diagram of the outline of the configuration of the boundary scan cell in the LSI in which a test pattern generated by the method of generating a test pattern for the integrated circuit is used.
Figure 8:
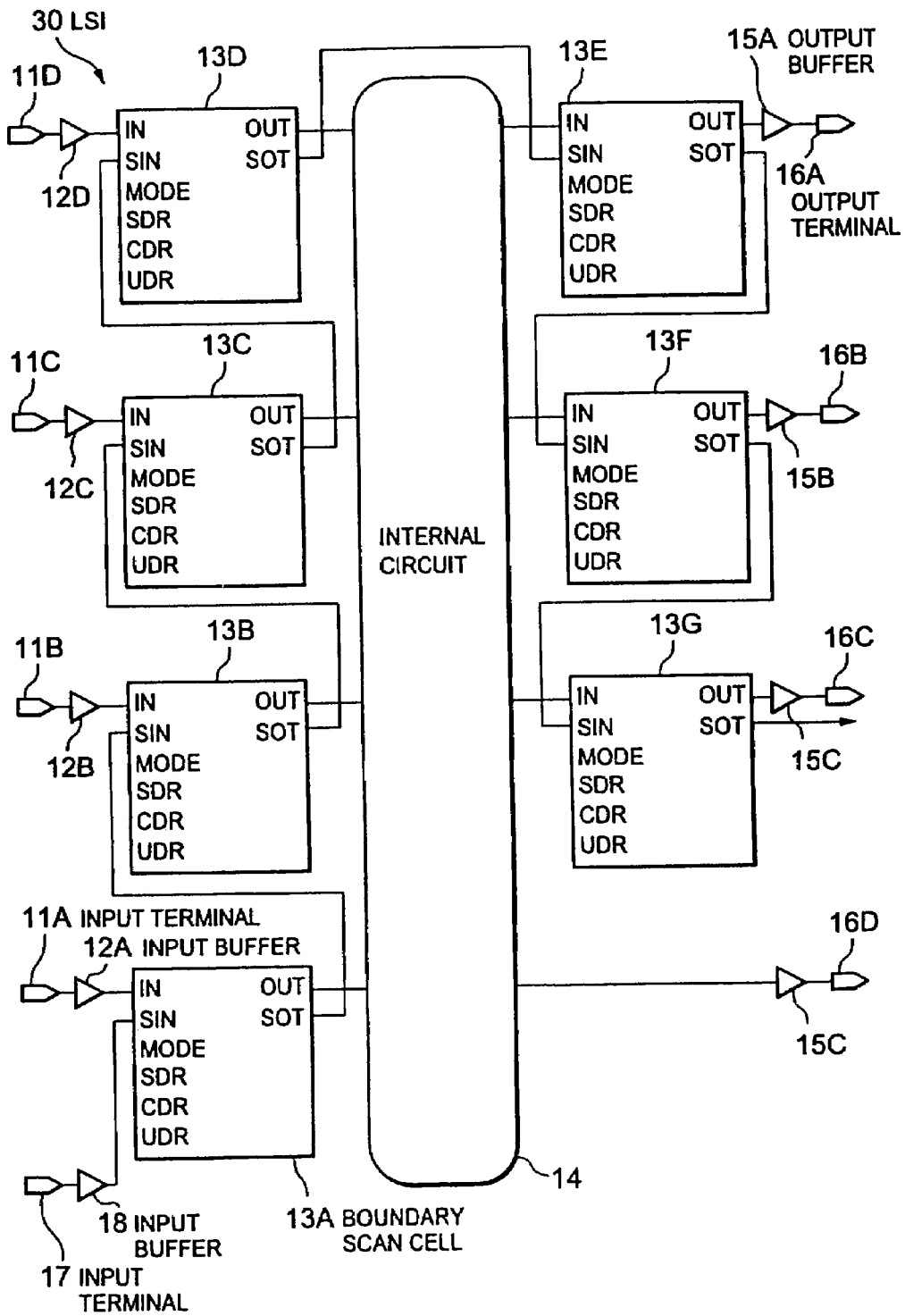
FIG. 8 is a block diagram of the outline of the configuration of another LSI in which a test pattern generated by the method of generating a test pattern for the integrated circuit is used.
Figure 9:
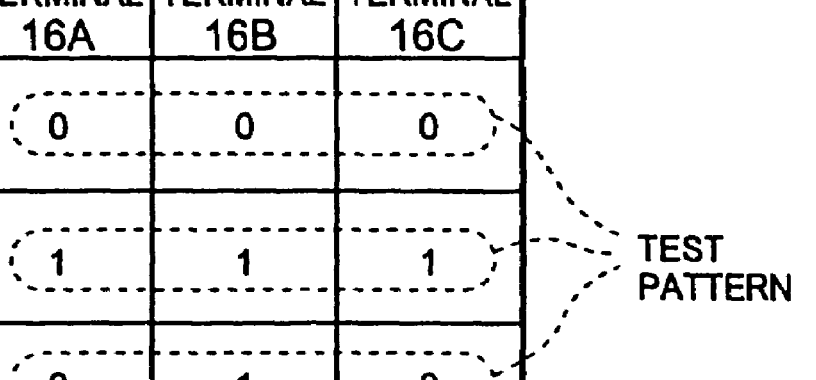
FIG. 9 shows another example of a test pattern processed by the method of generating a test pattern for the integrated circuit.
Figure 11:
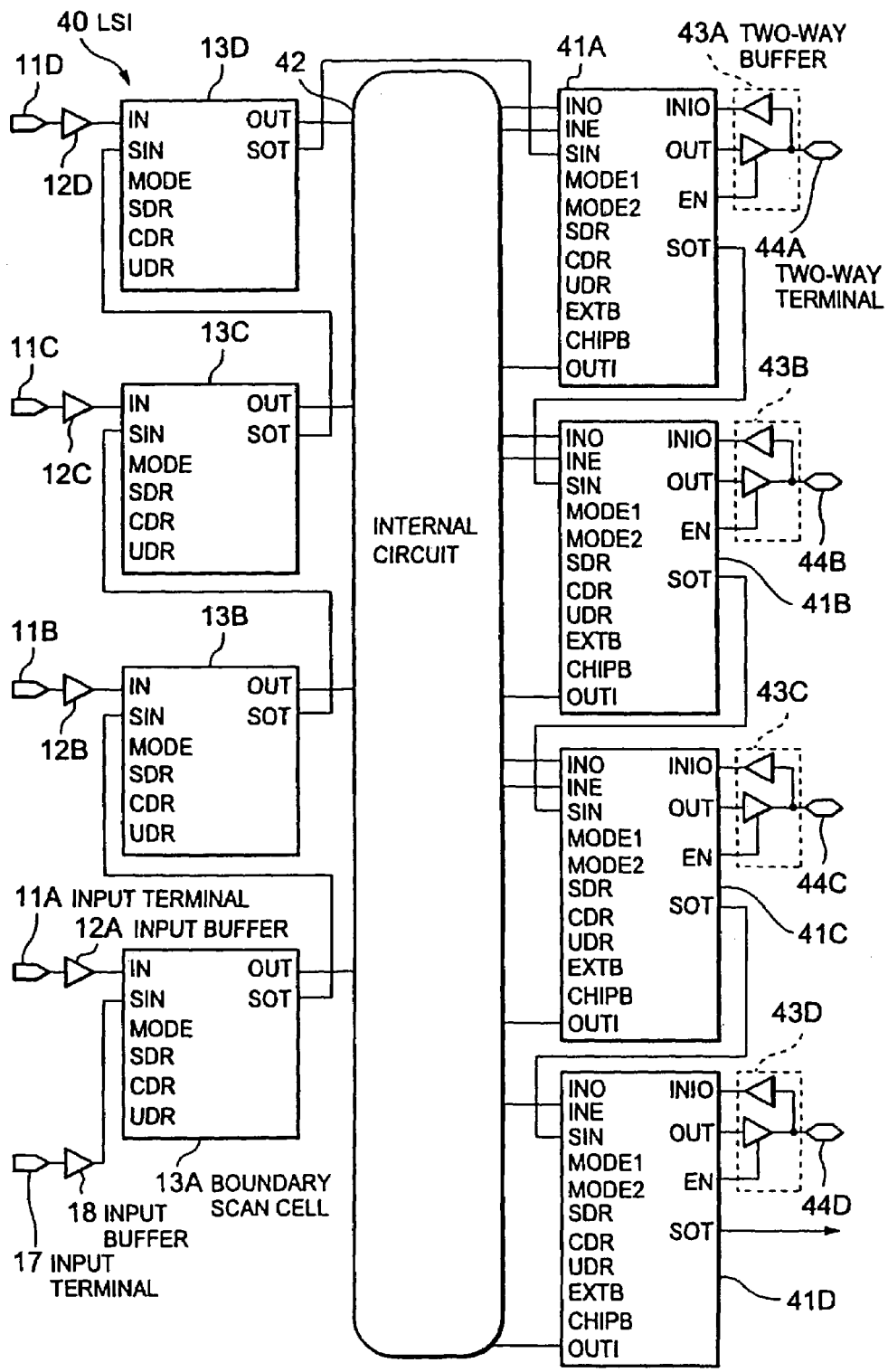
FIG. 11 is a block diagram of the outline of the configuration of another LSI in which a test pattern generated by the method of generating a test pattern for the integrated circuit is used.
Figure 12:
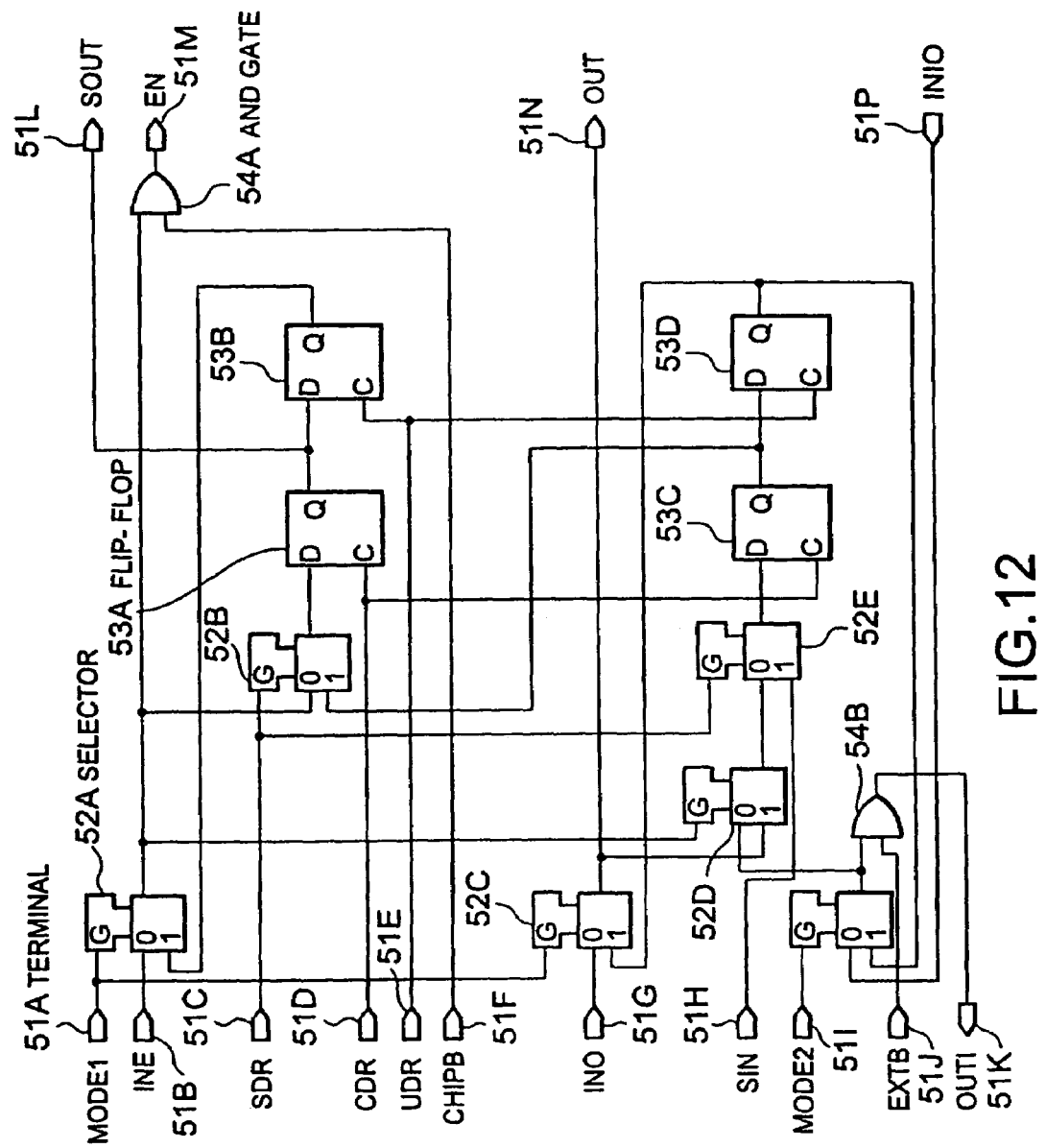
FIG. 12 is a block diagram of the outline of the configuration of the boundary scan cell in the LSI in which a test pattern generated by the method of generating a test pattern for the integrated circuit is used.
Figure 13:
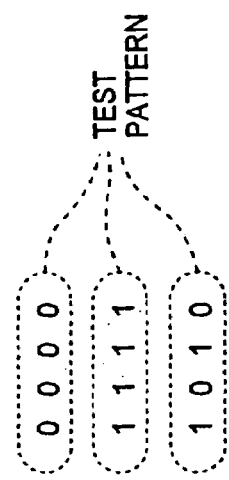
FIG. 13 shows another example of a test pattern processed by the method of generating a test pattern for the integrated circuit.
Figure 14:
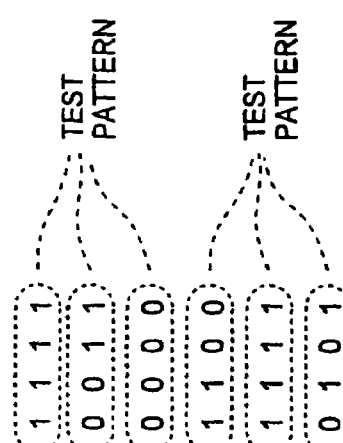
FIG. 14 shows an example of a test pattern generated by the method of generating a test pattern for the integrated circuit.

FIG. 1 is a flowchart of the method of generating a test pattern for an integrated circuit according to the first embodiment of the present invention. FIG. 2 is a flowchart of the method of generating a test pattern for the integrated circuit. FIG. 3 is a block diagram of the outline of the configuration of the simulation device for embodying the method of generating a test pattern for the integrated circuit. FIG. 4 is a block diagram of the outline of the configuration of an LSI in which a test pattern generated by the method of generating a test pattern for the integrated circuit is used. FIG. 5 is a block diagram of the outline of the configuration of the boundary scan cell in the LSI in which a test pattern generated by the method of generating a test pattern for the integrated circuit is used. FIG. 6 shows an example of a test pattern processed by the method of generating a test pattern for the integrated circuit. FIG. 7 shows an example of a test pattern generated by the method of generating a test pattern for the integrated circuit. FIG. 8 is a block diagram of the outline of the configuration of another LSI in which a test pattern generated by the method of generating a test pattern for the integrated circuit is used. FIG. 9 shows another example of a test pattern processed by the method of generating a test pattern for the integrated circuit. FIG. 10 shows an example of a test pattern generated by the method of generating a test pattern for the integrated circuit. FIG. 11 is a block diagram of the outline of the configuration of another LSI in which a test pattern generated by the method of generating a test pattern for the integrated circuit is used. FIG. 12 is a block diagram of the outline of the configuration of the boundary scan cell in the LSI in which a test pattern generated by the method of generating a test pattern for the integrated circuit is used. FIG. 13 shows another example of a test pattern processed by the method of generating a test pattern for the integrated circuit. FIG. 14 shows an example of a test pattern generated by the method of generating a test pattern for the integrated circuit.

The test pattern generation apparatus, shown in FIGS. 1 and 2, for embodying the method of generating a test pattern for an integrated circuit can be, for example, a simulation device shown in FIG. 3. The simulation device shown in FIG. 3 comprises an input unit 1, a storage unit 2, a central processing unit 3, an output unit 4, and a database 5.

The input unit 1 is operated by an operator, and receives a test pattern, etc. used when an LSI (large-scale integrated circuit) is tested. The output unit 4 outputs a test pattern generated by the central processing unit 3.

The database 5 stores a circuit of each type of LSIs. The LSI is tested using test data. The LSI stored in the database 5 uses a boundary scan system. FIG. 4 shows an ISI to which the boundary scan system is applied. An LSI 10 shown in FIG. 4 comprises input terminals 11A through 1D, an input terminal 17, input buffers 12A through 12D, an input buffer 18, boundary scan cells 13A through 13H, an internal circuit 14, output buffers 15A through 15D, and output terminals 16A through 16D.

The input terminals 11A through 11D are used to input common data. The output terminals 16A through 16D are used to output the common data. The input terminal 17 is used to input test data.

The input buffers 12A through 12D transmit the data applied to the input terminals 11A through 11D respectively to the boundary scan cells 13A through 13D. The output buffers 15A through 15D transmit the data output from the boundary scan cells 13E through 13H respectively to the output terminals 16A through 16D.

The internal circuit 14 is a logical circuit comprising various types of gates, etc.

The boundary scan cells 13A through 13H transmit the common data to the internal circuit 14. In addition, the test data is set in the boundary scan cells 13A through 13H when a test is conducted. FIG. 5 shows an example of the boundary scan cells 13A through 13H. The boundary scan cell shown in FIG. 5 comprises a MODE terminal 21A, an IN terminal 21B, an SDR terminal 21C, an SIN terminal 21D, a CDR terminal 21E, a UDR terminal 21F, an SOT terminal 21G, an OUT terminal 21H, selectors 22 and 23, and flip-flops 24 and 25.

The selectors 22 and 23 output the data applied to a zero (0) terminal when a selection signal of "0" is applied to the G terminal, and output the data applied to a one (1) terminal when a selection signal of "1" is applied to the G terminal.

The flip-flops 24 and 25 are D flip-flops, read a value applied to the D terminal when the clock signal applied to the C terminal turns from "0" to "1," and output the read value through the Q terminal.

When the data applied to the IN terminal 21B is output from the OUT terminal 21H by using the boundary scan cell shown in FIG. 5, that is, when the boundary scan cells 13A through 13H are used in a normal mode, the selection signal of the MODE terminal 21A is set to "0." Thus, the data applied to the IN terminal 21B is output to the OUT terminal 21H through the selector 22.

When the test data is set in the boundary scan cells 13A through 13H, that is, when the boundary scan cells 13A through 13H are used in the shift mode, the selection signal of the SDR terminal 21C is set to "1." Thereby, the test data applied to the SIN terminal 21D from the boundary scan cells at the previous step is output to the SOT terminal 21G through the selector 23 and the flip-flop 24 according to the test clock applied to the CDR terminal 21E. As a result, since the test data is stored in the flip-flop 24 of the boundary scan cells 13A through 13H, it is set in the boundary scan cells 13A through 13H.

When the test data set in the boundary scan cells 13A through 13H is output, the selection signal of the MODE terminal 21A is set to "1."

Afterwards, when the test clock of the UDR terminal 21F changes its value, the test data of the flip-flop 24 is output to the OUT terminal 21H through the flip-flop 25 and the selector 22.

The central processing unit 3 generates a test pattern for the LSI 10 in the method of generating a test pattern for an integrated circuit, that is, in the process shown in FIGS. 1 and 2 according to the procedure stored in the storage unit 2. The central processing unit 3 performs an initial pattern process as shown in FIGS. 1 and 2 (step S1). In step S1, the initial pattern from the test data is set in the boundary scan cells 13A through 13H. An initial pattern can be one which does not generate noise on the power supply or ground in accordance with the change of the output buffers 15A through 15D, or one which does not affect a value in the internal circuit 14. That is, if an output buffer generates noise when the output buffer is activated according to an initial pattern, then the feature of the present invention that the noise generated with a change of a pattern can be reduced is nullified. The above described initial pattern is finally stored in the flip-flops 25 of the boundary scan cells 13A through 13H.

The method of setting an initial pattern can be the following method other than the shifting operation. That is, the boundary scan cells 13A through 13H are operated in the normal mode, and the value of the IN terminal 21B is stored in the flip-flop 25 through the selector 23 and the flip-flop 24 without using the value stored in the flip-flop 24. Thus, the initial pattern can be set in the boundary scan cells 13A through 13H.

There is another method of setting an initial pattern as follows. That is, when it is determined beforehand that noise can be reduced by setting different output values in adjacent output buffers, the boundary scan cells 13A through 13H are set in the shift mode using an initial pattern such that different values can be output to the output buffers 15A through 15D. Using such an initial pattern, noise is not suddenly and disadvantageously generated by setting the initial pattern.

When the initial pattern is completely set in step S1, the variable k is set to a value obtained by subtracting "1" from the number of the pattern to be first processed (step S2). That is, $$k = \text{starting pattern number} - 1$$

where the variable k indicates the number of the test pattern currently processed. When the test pattern processed by the central processing unit 3 is as shown in FIG. 6, the central processing unit 3 processes three test patterns. The first test pattern having the pattern number "0" is "0000."

The second test pattern having the pattern number "1" is "1111." The third test pattern having the pattern number "2" is "0101."

After the process in step S2, the central processing unit 3 sets the variable k in step S2 as follows (step S3).

k=k+1

After the process in step S3, the central processing unit 3 determines whether or not the variable k in step S3 is larger than the number of the last test pattern (step S4). If the variable k is larger than the number of the last test pattern in step S4, then the central processing unit 3 terminates the process.

If the variable k is equal to or smaller than the number of the last pattern, then the central processing unit 3 sets the test pattern after a change using the shift mode of the boundary scan cells 13A through 13H (step S5). In the case shown in FIG. 6, the test pattern "1111" having the pattern number "1" is set as a test pattern after the change.

When the process in step S5 is completed, the central processing unit 3 sets the test pattern before the change using the shift mode of the boundary scan cells 13A through 13H (step S6). In the case shown in FIG. 6, the test pattern "0000" having the pattern number "0" is set as a test pattern before the change.

When the process in step S6 is completed, the central processing unit 3 extracts the output terminals 16A through 16D whose outputs have changed (step S7). In the case shown in FIG. 6, since the test pattern after the change is "1111," and the test pattern before the change is "0000," the terminals whose outputs have changed are the output terminals 16A through 16D.

After the process in step S7, the central processing unit 3 sets the variable m used in the method of generating a test pattern to m=0 (step S8). The variable m indicates the number of output terminals whose outputs change. For example, when the variable is "2," the values of the first and second output terminals are changed.

After the process in step S8, the central processing unit 3 sets the variable to m=m+1 (step S9). After the process in step S9, the central processing unit 3 determines whether or not the variable m is larger than the number of output terminals which have been extracted in step S7 and whose values have changed (step S10). If the variable m is equal to or smaller than the number of output terminals whose values have changed in step S10, then the central processing unit 3 obtains, from the noise value defined in the output buffers 15A through 15D, the value of the noise generated when the value of the m-th output terminal (m is the variable) is changed (step S11). In the case shown in FIG. 6, the central processing unit 3 sets each noise value to 10 when the values of the output buffers 15A through 15D are changed from "0" to "1," and from "1" to "0."

When the process in step S11 is completed, the central processing unit 3 determines whether or not a predetermined noise value obtained in step S11 is larger than an allowable value for the noise value (step S12). In the case shown in FIG. 6, the central processing unit 3 sets to "20" the allowable value for the noise used in step S12.

If the above described noise value is equal to or smaller than the allowable value, then the central processing unit 3 returns control back to step S9. If the noise value is larger than the above described allowable value in step S12, then the central processing unit 3 generates a test pattern, in which changed are the values of the first through the (m−1)th output terminals in the output terminals whose values have changed, and outputs the pattern through the output unit 4 (step S13). Then, the central processing unit 3 returns control to step S6.

If the value m is larger than the number of output terminals whose outputs have changed in step S10, then the central processing unit 3 generates a test pattern, in which changed are the values of the first through the (m−1)th output terminals in the output terminals whose values have changed, and outputs the test pattern through the output unit 4 (step S14). Then, the central processing unit 3 returns control to step S3.

In the case shown in FIG. 6, in the processes in steps S10 through S13, the central processing unit 3 generates a test pattern in which changed are the values of the first and second output terminals in the output terminals whose values have changed. That is, the central processing unit 3 generates a test pattern in which changed are the values of the first and second output terminals 16A and 16B as an amendment to the test pattern having the pattern number "0" shown in FIG. 6, and outputs the generated pattern as a test pattern having the pattern number "1-1" shown in FIG. 7 through the output unit 4.

After the central processing unit 3 generates the test pattern having the pattern number "1-1," the central processing unit 3 similarly generates the test pattern having the pattern number "1-2" in steps S6 through S14, and outputs the test pattern through the output unit 4 finally in step S14.

Then, the central processing unit 3 returns control to the process in step S3, and similarly processes the test patterns having the pattern numbers "1" and "2." As a result, even if the pattern is changed from "0000" to "1111," the test pattern "1100" intervenes between the patterns. Therefore, it prevents noise from occurring when the output buffers simultaneously change. In addition, since delay elements, etc. are not added to the circuit, the overhead in the circuit can be avoided.

An LSI 30 shown in FIG. 8 can be an LSI stored in the database 5. In FIG. 8, the units also shown in FIG. 4 are assigned the same unit numbers as in FIG. 4, and the detailed explanation is omitted here. The LSI 30 shown in FIG. 8 is obtained by removing the boundary scan cell 13H from the LSI shown in FIG. 4, and transmits the data from the internal circuit 14 to the output terminal 16D through the output buffer 15D.

The central processing unit 3 generates a test pattern for the LSI 30 as follows. That is, since the above described boundary scan cell does not intervene between the internal circuit 14 and the output buffer 15D, the central processing unit 3 assumes that the output value from the output terminal 16A constantly changes, and performs a test pattern generating process shown in FIGS. 1 and 2. At this time, when the central processing unit 3 performs the test pattern generating process, the output terminal 16D is excluded, and the noise value of the output buffer 15D is removed from the allowable value in step S12 in the processes shown in FIGS. 1 and 2.

For example, when the test pattern shown in FIG. 9 is processed, similarly as the case of FIG. 6, the central processing unit 3 sets each noise value to "10" in step S11 when the output values of the output buffers 15A through 15D are changed from "0" to "1," and when they are changed from "1" to "0." In addition, the central processing unit 3 sets the noise allowable value in step S12 to "20." Upon these conditions and the condition that the output value of the output terminal 16A constantly changes, the number of buffers whose output values can be inverted is one.

Thus, the central processing unit 3 inserts the pattern "100" having the pattern number "1-1" and the pattern "110" having the pattern number "1-2" whose values change one by one as shown in FIG. 10 between the pattern "000" having the pattern number "0" and the pattern "111" having the pattern number "1" shown in FIG. 9. In addition, the central processing unit 3 inserts the pattern "011" having the pattern number "2-1" as shown in FIG. 10 between the pattern "111" having the pattern number "1" and the pattern "010" having the pattern number "2" as shown in FIG. 9.

Thus, even if the boundary scan cell is not connected to the output terminal, the number of buffers whose output values can be inverted is limited by a noise allowable value, thereby preventing noise from being generated on the power supply and ground.

An LSI 40 shown in FIG. 11 can be an LSI stored in the database 5. The LSI 40 shown in FIG. 11 comprises the input terminals 11A through 11D, the input buffers 12A through 12D, the boundary scan cells 13A through 13D, the input terminal 17, the input buffer 18, boundary scan cells 41A through 41D, an internal circuit 42, two-way buffers 43A through 43D, and two-way terminals 44A through 44D. In FIG. 11, the units also shown in FIG. 4 are assigned the same numbers as in FIG. 4, and the detailed explanation is omitted here.

The two-way buffers 43A through 43D output the data from the OUT terminals of the boundary scan cells 41A through 41D respectively to the two-way terminals 44A through 44D when the EN terminals of the boundary scan cells 41A through 41D are "1." On the other hand, the two-way buffers 43A through 43D output the data from the two-way terminals 44A through 44D of the boundary scan cells 41A through 41D respectively to the boundary scan cells 41A through 41D when the EN terminals of the boundary scan cells 41A through 41D are "0."

The boundary scan cells 41A through 41D input and output data in two ways to and from the two-way terminals 44A through 44D through the two-way buffers 43A through 43D. FIG. 12 shows an example of the boundary scan cells 41A through 41D. The boundary scan cell shown in FIG. 12 comprises a MODE1 terminal 51A, an INE terminal 51B, an SDR terminal 51C, a CDR terminal 51D, a UDR terminal 51E, a CHIPB terminal 51F, an INO terminal 51G, an SIN terminal 51H, a MODE2 terminal 51I, an EXTB terminal 51J, an OUTI terminal 51K, an SOUT terminal 51L, an EN terminal 51M, an OUT terminal 51N, an INIO terminal 51P, selectors 52A, 52B, 52C, 52D, 52E, and 52F, flip-flops 53A, 53B, 53C, and 53D, and an AND gate 54A. When the data from the internal circuit 42 is output to the two-way buffer using the boundary scan cell shown in FIG. 12, the selection signal of the MODE1 terminal 51A is set to "0." Thus, an enable signal from the INE terminal 51B is applied to the AND gate 54A through the selector 52A. At this time, according to the enable signal of the INE terminal 51B and the mode signal of the CHIPB terminal 51F, the AND gate 54A outputs "1" from the EN terminal 51M to the two-way buffer. Then, it is applied to the INO terminal 51G. The data from the internal circuit 42 is output to the two-way buffer from the OUT terminal 51N through the selector 52C.

When the data from the two-way buffers 43A through 43D is output to the internal circuit 42, "0" is output from the EN terminal 51M, the selection signal of the MODE2 terminal 51I is set to "0," and the mode signal of the EXTB terminal 51J is set to "1." Thus, the data from the two-way buffer applied to the INIO terminal 51P is output from the OUTI terminal 51K to the internal circuit 42 through the selector 52F and the AND gate 54B.

When the test data is set in the boundary scan cells 41A through 41D, the selection signal of the SDR terminal 51C is set to "1." Thus, the test data applied to the SIN terminal 51H from the boundary scan cell at the previous stage is output to the SOUT terminal 51L through the selector 52E, the flip-flop 53C, the selector 52B, and the flip-flop 53A according to the test clock applied to the CDR terminal 51D. Thus, the test data is set in the boundary scan cell.

When the set test data is output to the two-way terminal through the two-way buffer, the selection signal of the MODE1 terminal 51A is set to "1," and the enable signal of "1" is output from the EN terminal 51M. Then, if the test clock of the UDR terminal 51E changes, the test data of the flip-flop 53C is output to the OUT terminal 51N through the flip-flop 53D and the selector 52C.

For the LSI 40, the central processing unit 3 generates a test pattern for the LSI 40 as follows. That is, the central processing unit 3 generates a test pattern as shown in FIGS. 1 and 2 only when the two-way buffers 43A through 43D can output data to the two-way terminals 44A through 44D.

That is, the central processing unit 3 generates a test pattern for the LSI 40 as follows. When the two-way buffers 43A through 43D output the data from the OUT terminals of the boundary scan cells 41A through 41D to the two-way terminals 44A through 44D respectively, a test pattern generating process shown in FIGS. 1 and 2 is performed. At this time, when the EN terminal of the boundary scan cells 41A through 41D changes from "0" to "1," a test pattern generating process is performed based on the last value obtained immediately before the change.

For example, if the pattern number changes from "1" to "2" when the test pattern generating process shown in FIG. 13 is performed, then the EN terminal of the boundary scan cells 41A through 41D changes from "0" to "1." At this time, the central processing unit 3 starts the process shown in FIGS. 1 and 2 using as the initial pattern the value "1111" received by the boundary scan cells 41A through 41D when the pattern number is "1." That is, the central processing unit 3 enters "1111" of the pattern number "2-1" after the pattern number "1" as shown in FIG. 14 and starts the process with the pattern number "2-1."

Thus, the central processing unit 3 sequentially inserts "0011" and "0000" as the pattern number "2-2" and "2-3" respectively after the pattern number "2-1." Since the process after this process is the same as that shown in FIG. 7, the detailed explanation is omitted here. The storage unit 2 enters "0101" of the pattern number "5-1" when the EN terminal turns to "0" to maintain the value of the two-way terminals 44A through 44D after generating the last pattern "0101."

Thus, even if the boundary scan cells 41A through 41D are used, the number of buffers whose output values may be inverted is limited by the noise allowable value, thereby it is possible to prevent the noise from being generated on the power supply and ground.

Second Embodiment

Described below is the second embodiment of the present invention.

Figure 15:
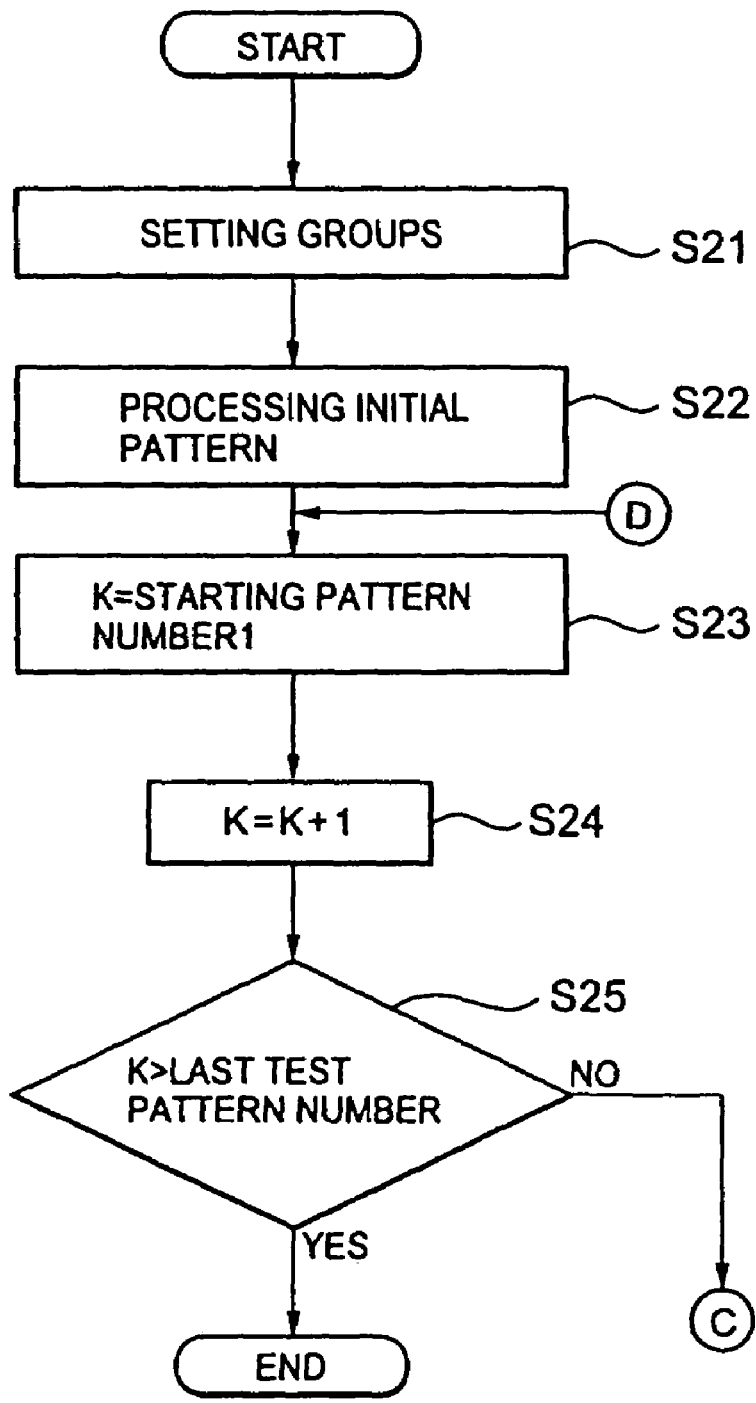
FIG. 15 is a flowchart showing a method of generating a test pattern for the integrated circuit according to the second embodiment of the present invention.
Figure 16:
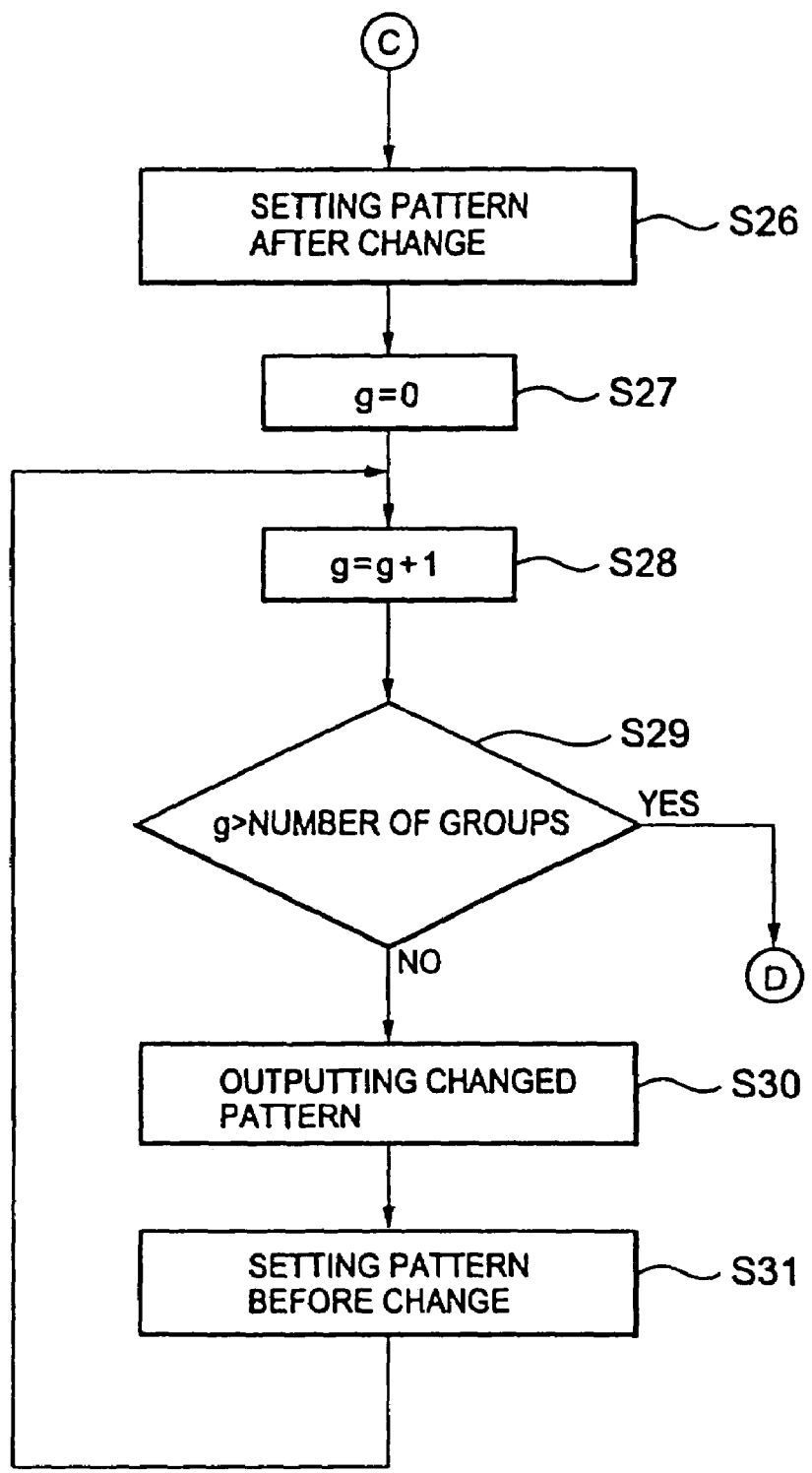
FIG. 16 is a flowchart showing a method of generating a test pattern for the integrated circuit.
Figure 17:
FIG. 17 shows the grouping process in the method of generating a test pattern of the integrated circuit.
Figure 19:
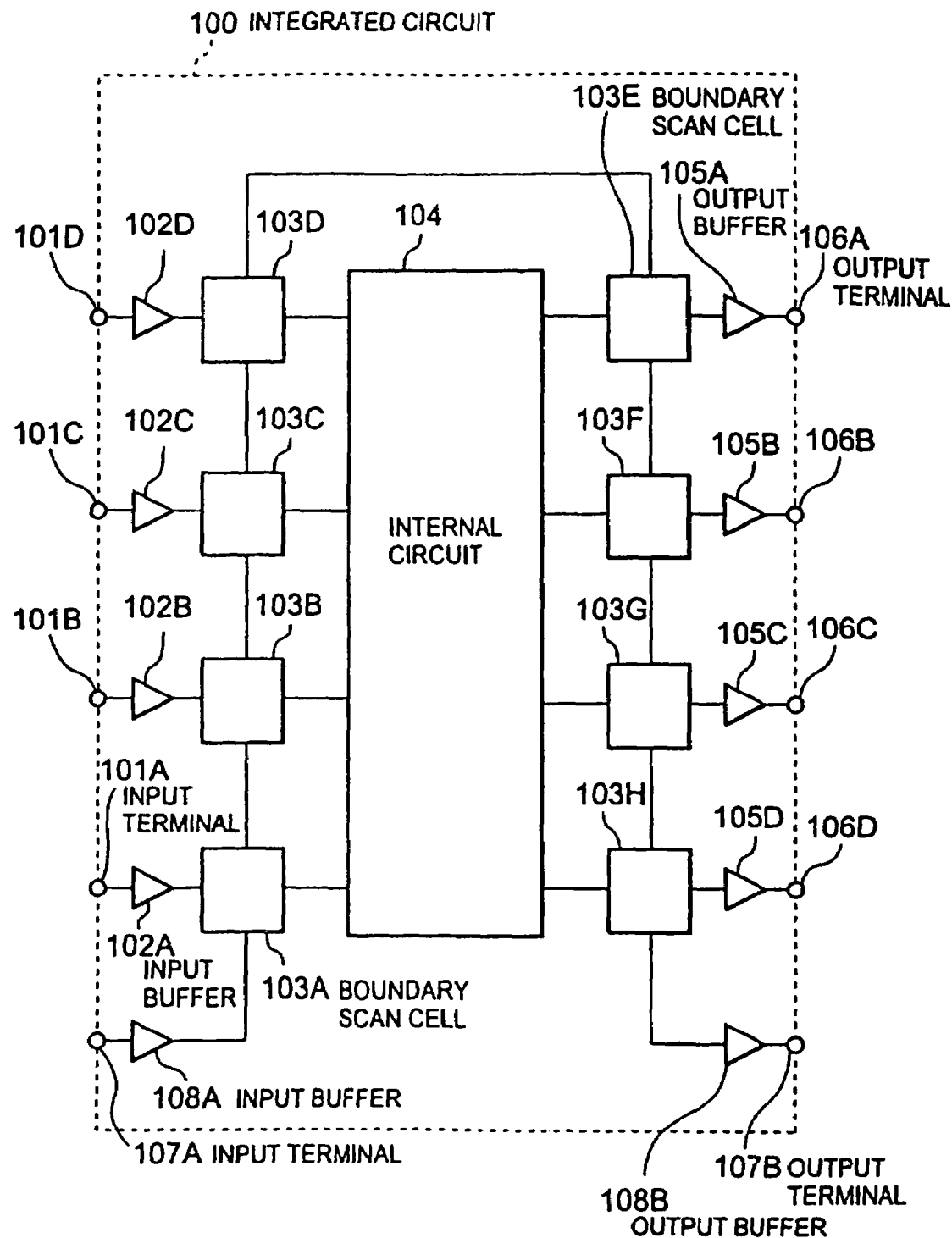
FIG. 19 shows the outline of the configuration of an integrated circuit using a boundary scan system.

FIG. 15 is a flowchart showing a method of generating a test pattern for the integrated circuit according to the second embodiment of the present invention. FIG. 16 is a flowchart showing a method of generating a test pattern for the integrated circuit. FIG. 17 shows the grouping process in the method of generating a test pattern of the integrated circuit. FIG. 18 shows an example of a test pattern generated by the method of generating a test pattern for the integrated circuit.

Since the second embodiment is different from the first embodiment only in procedure stored in the storage unit 2, only this point will be explained here. In the procedure stored in the storage unit 2 of the embodiment, the central processing unit 3 performs the following process. That is, the central processing unit 3 groups the output terminals (step S21). Even if all output terminals in a group simultaneously change, the central processing unit 3 sets the noise value generated from the change within the range of the allowable value. In step S21, the central processing unit 3 groups, for example, the output terminals 16A through 16D shown in FIG. 4 into the first and second groups as shown in FIG. 17.

When the grouping process in step S21 is completed, the central processing unit 3 performs the processes in steps S22 through S26. Since the processes in steps S22 through S26 are the same as those in steps S1 through S5 shown in FIG. 1, the detailed explanation is omitted here.

When the process in step S26 is completed, the central processing unit 3 sets the variable g indicating a group to an initial value, that is, g=0 (step S27). Then, the central processing unit 3 sets the variable g in step S27 to g=g+1 (step S28). In the case shown in FIG. 17, the variable g is "1" in step S28 at the start of the process, and the first group is to be processed.

When the process in step S28 is completed, the central processing unit 3 determines whether or not the variable g in step S28 is larger than the number of groups determined in step S21 (step S29). If the variable g is smaller than the number of groups in step S29, the central processing unit 3 replaces the pattern of the g-th group set in step S26 with a pattern after the change, and the pattern of the second group remains (step S30). In the case shown in 17, the central processing unit 3 replaces the pattern "00" of the first group having the pattern number "1" with the pattern "11," keeps the pattern "00" of the second group as is, and generates a test pattern "0011" having the pattern number "2-1" as shown in FIG. 18.

When the process in step S30 is completed, the central processing unit 3 sets the test pattern generated in step S30 as the pattern set before the change (step S31), and returns control to step S28. In the case shown in FIG. 17, the central processing unit 3 generates the test pattern "1111" having the pattern number "2-2" after the test pattern "1100" having the pattern number "2-1" as shown in FIG. 18.

In step S29, when the variable g becomes larger than the number of groups, the central processing unit 3 returns control to step S23. In the case shown in FIG. 17, the central processing unit 3 generates the test pattern "0111" having the pattern number "3-1," and the test pattern "0101" having the pattern number "3-2" shown in FIG. 18.

Thus, according to the present embodiment, a noise allowable value is set for each group, and an output value is changed for each group. As a result, the conventional delay element is not required, and the overhead of a circuit is reduced, and the noise can be prevented from being generated by the simultaneous change in output buffers.

Described above in detail by referring to the attached drawings are the first and second embodiments of the present invention. However, a concrete configuration is not limited to the above described embodiments, but the present invention also contains a change in design within a range of the feature of the present invention. For example, in FIG. 14, it is not necessary to insert any pattern number "5-1" if there is no problem with a change in value of the two-way buffers 43A through 43D when the mode is switched.

As described above, with the configurations according to the present invention, a test pattern is generated by limiting the change in output terminal using an allowable value, and by allowing only a change in an output terminal in a group.

As a result, noise can be prevented from being generated by simultaneous changes in output buffers. In addition, since any delay unit is not required like the conventional technology, the generation of an overhead of a circuit can be avoided.

What is claimed is:

1. A method of generating a test pattern for an integrated circuit set in m scan flip-flops (m indicates any natural number) when m outputs from a logical circuit are applied to m output terminals through m scan flip-flops and m output buffers, comprising:

a first process of counting the total number of output buffers, whose output values change, when said m scan flip-flops output an input pattern to said m output buffers;

a second process of checking a total noise value generated from all output buffers counted in said first process based on a noise value defined for each of said m output buffers;

a third process of selecting output buffers from the total output buffers counted in said first process such that said total noise value is at most equal to an allowable noise value; and a fourth process of outputting the test pattern obtained by amending the input pattern output to the m output buffers such that only the output buffers selected in said third process can change output values, thereby insuring that said total noise value is at most equal to said allowable noise value upon performing said fourth process.

2. The method according to claim 1, wherein said second through fourth processes are repeated on said output buffer not selected in said third process when said fourth process is completed.

3. A method of generating a test pattern for an integrated circuit set in m scan flip-flops (m indicates any natural number) when m outputs from a logical circuit are applied to m output terminals through m scan flip-flops and m output buffers, and n (n indicates any natural number) outputs from the logical circuit are applied to n output terminals through n output buffers, and without passing through said m scan flip-flops, comprising:

a first process of counting the total number of output buffers, whose output values change, when said m scan flip-flops output an input pattern to said m output buffers;

a second process of checking a first sum of noise value generated from all output buffers counted in said first process based on a noise value defined for each of said m output buffers, a second sum of noise value generated from said n output buffers when output values of said n output buffers are changed based on a noise value defined for each of said n output buffers, and total noise value of said first and second sum of noise value;

a third process of selecting output buffers from the total output buffers counted in said first process such that said total noise value is at most equal to an allowable noise value; and a fourth process of outputting the test pattern obtained by amending the input pattern such that only the output buffers selected in said third process can change output values, thereby insuring that said total noise value is at most equal to said allowable noise value upon performing said fourth process.

4. A method of generating a test pattern for an integrated circuit set in m scan flip-flops (m indicates any natural number) when m outputs from a logical circuit are applied to m output terminals through m scan flip-flops and m output buffers, comprising:

a first process of grouping said scan flip-flops such that a total noise value, generated when all output values of said output buffers belonging to a specific group are changed, is at most equal to an allowable noise value, said total noise value being checked based on a noise value defined for each of said output buffers;

a second process of selecting one group from among groups generated in said first process, each of said groups generated in said first process being generated such that said total noise value is at most equal to said allowable noise value;

a third process of outputting as the test pattern a pattern in which only output values of output buffers belonging to the group selected by said second process changes when said m scan flip-flops output input patterns to said m output buffers, and output values of output buffers belonging to groups not selected in said second process remain unchanged, thereby insuring that said total noise value is at most equal to said allowable noise value upon performing said third process; and a fourth process of repeating said second and third processes on the groups not selected in said second process when said third process is completed.

* * * * *